United States Patent [19]

McNay

[11] 4,088,994

[45] May 9, 1978

[54] PARALLELED OUTPUT SELF-ENCODING KEYBOARD

[75] Inventor: Steven Ralph McNay, Aurora, Ill.

[73] Assignee: Motorola, Inc., Schaumburg, Ill.

[21] Appl. No.: 678,810

[22] Filed: Apr. 21, 1976

[51] Int. Cl.$^2$ .............................................. G08C 1/00
[52] U.S. Cl. ............................. 340/365 C; 340/365 S
[58] Field of Search ................................... 340/365 C

[56] References Cited

U.S. PATENT DOCUMENTS

| | | | |
|---|---|---|---|
| 3,119,996 | 1/1964 | Comstock | 340/365 C |
| 3,399,410 | 8/1968 | Ellis | 340/365 C |
| 3,588,875 | 6/1971 | Gabor | 340/365 C |
| 3,778,817 | 12/1973 | Silverberg | 340/365 C |
| 3,973,255 | 8/1976 | Freeman | 340/365 C |

Primary Examiner—Thomas B. Habecker
Attorney, Agent, or Firm—Margaret Marsh Parker; James W. Gillman

[57] ABSTRACT

A standard format keyboard provides a paralleled, binary-coded output corresponding to an alphanumeric character or a function when the appropriate key head is depressed. A signal is coupled through the key mechanism to a set of parallel conductors which are positioned to be approached by a portion of the key mechanism. The conductors have minimum or maximum areas corresponding to binary zeros and ones, whereby the level of signal coupled also corresponds to a binary code (such as ASCII) for the character or function key depressed.

8 Claims, 6 Drawing Figures

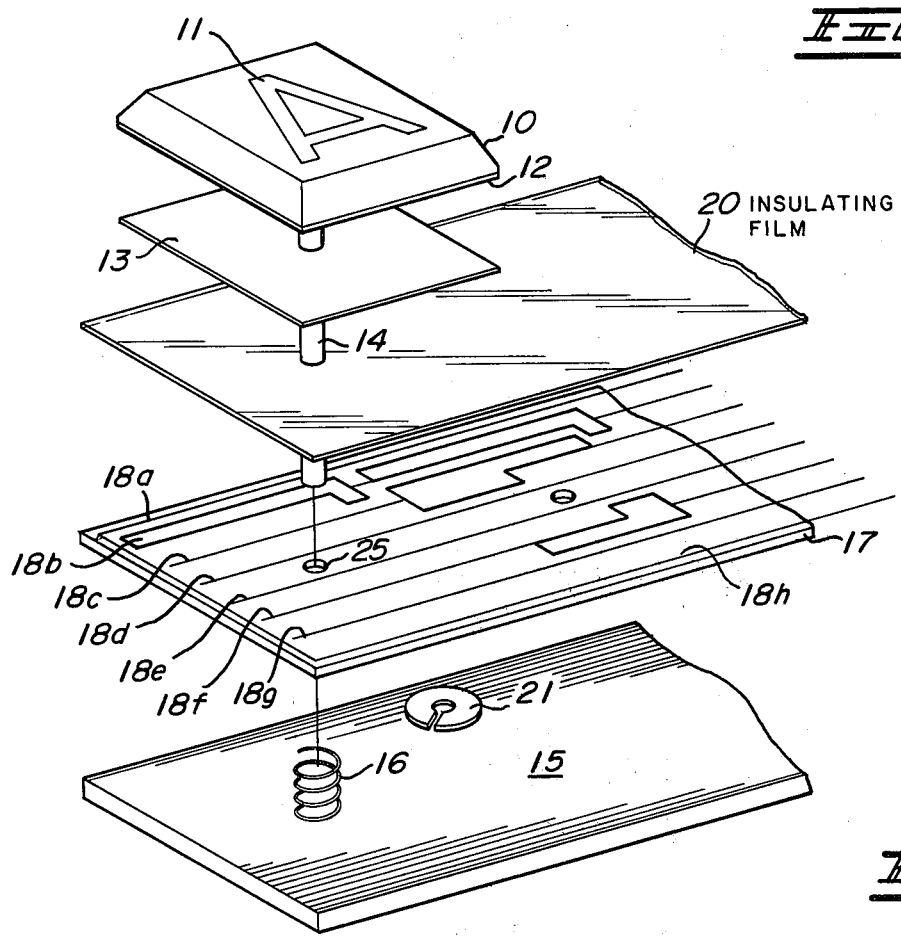
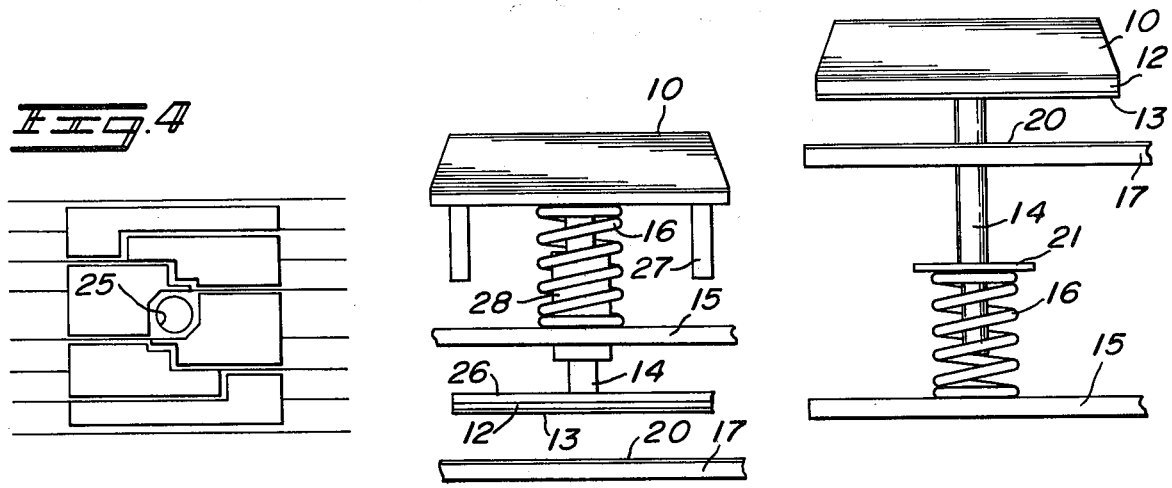
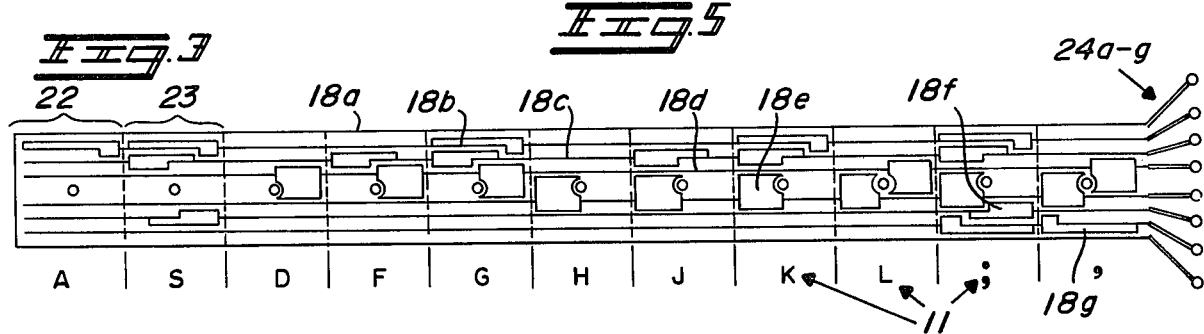

PARALLELED OUTPUT SELF-ENCODING KEYBOARD

BACKGROUND OF THE INVENTION

The present invention relates to the field of keyboards for devices utilizing coded binary signals and particularly to a keyboard which is self-encoding.

Since the advent of data display and other types of systems devices utilizing binary codes representative of alphanumeric characters or control functions, a number of keyboard-connected systems have been devised to provide coded information, but all have had major disadvantages. Many of these systems have the costly disadvantage of requiring each character or function key to be unique in some way, and some of these systems cannot even utilize standard typewriter keyboard format and spacing. Systems which do use identical keys require elaborate switching and/or highly individualized wiring to produce the coded output signal. Typical instructions for keyboard encoders to be coupled to a keyboard read, "Use Truth Tables and required output codes to determine wiring from each key to the two Encoders". Some of these latter also require complex diode matrices to produce the coded output.

SUMMARY OF THE INVENTION

It is an object of the present invention to provide a keyboard which will produce directly a binary coded output.

It is a particular object to provide such a keyboard using standard format and conformation and requiring no new manual skill on the part of the user.

It is another particular object of the invention to provide a parallel binary output directly from the keyboard itself without complex circuitry, switches or other expensive components.

The above objectives are accomplished in the self-encoding keyboard of the invention which includes a support member such as an insulated printed circuit board having a plurality of conductive portions mounted thereon, and the areas of the portions having a predetermined relationship to a desired signal output. The printed circuit board may be covered by an insulating layer such as a thin Mylar film. Each one of the key mechanisms includes a head and a conductive surface portion which are normally biased away from the printed circuit board and mounted to be movable toward the board, thus causing the conductive surface portion of the key mechanism to approach the conductive portion on the board. A signal source is coupled to the conductive surface portion of the key mechanism when the key mechanism is fully depressed. A plurality of detectors is also included, each coupled to at least one of the conductive portions on the printed circuit board for detecting a change of output signal level caused by the relative motion of the conductive portion of the key mechanism and the printed circuit board.

BRIEF DESCRIPTION OF THE DRAWINGS

FIG. 1 is an exploded view of a portion of the keyboard according to the invention.

FIG. 2 is a side view of a portion of the keyboard portion of FIG. 1.

FIG. 3 is a plan view of one section of a conductor pattern according to the invention.

FIG. 4 is a plan view of another possible conductor pattern.

FIG. 5 is a side view of another embodiment of the keyboard portion of FIG. 2.

DESCRIPTION OF A PREFERRED EMBODIMENT

Figure 6:
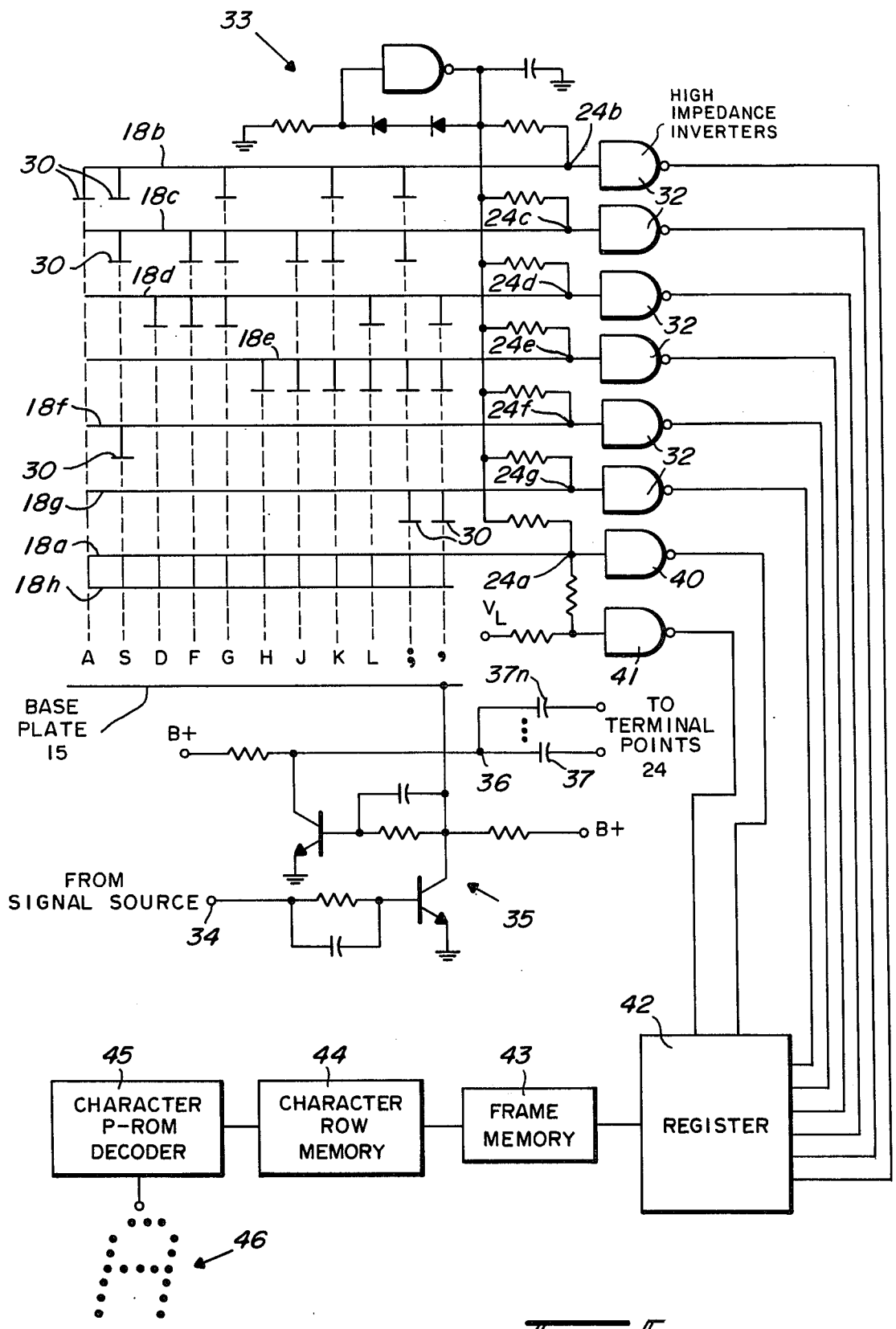
FIG. 6 is a block diagram of the keyboard of the invention and its associated circuitry.

FIG. 1 shows a view of a portion of the system, including a key head 10, bearing an indicia 11 on its top surface and a resilient pressure pad 12 on its underside. A thin conductive layer or foil 13 is fastened to the lower surface of the pressure pad 12 and the head is mounted on a supporting post 14. When the key head 10 is depressed, the bottom of the supporting post 14 will contact a conductive base plate or surface 15, the head 10 being normally biased away from the plate by a spring 16. The spring 16 may not provide all or any part of a conductive path between the plate 15 and the foil 13. In this preferred embodiment, the support post 14 is of metal, but the scope of the invention is intended to cover any and all means of selectively making electrical contact between the conductive plate 15 and the foil 13. A signal source (not shown) is coupled to the plate 15. Between the key head 10 and the plate 15 is mounted a support member, typically a printed circuit board 17, having on its surface a plurality of conductors 18a–18h. Each conductor runs the length of a row of keys. A thin insulating film 20, of a plastic material such as is commercially available under the trademark Mylar, covers the conductors 18.

FIG. 2 shows the key mechanism of FIG. 1 assembled and in its normal, biased position. A small plate 21 is shown here, affixed to the support post 14 for cooperating with the biasing spring 16. Specific mounting means has not been indicated for the entire key mechanism, printed circuit board 17 or the base plate 15 since any suitable means will suffice.

FIG. 3 is a view of the conductor pattern for one row of keys of a standard typewriter keyboard format, corresponding to the row of indicia 11 as shown. Each conductor extends at least the length of the keyboard row. Above the indicia "A" is a section 22 of the conductors 18a–18h which underlies the key head bearing the indicia "A". Above the letter "S" is a section 23 which would underlie the "S" key head. When a signal, e.g., a horizontal sweep oscillator output, is coupled to the base plate 15 and the "A" key is depressed, the signal is coupled to the foil 13 on the key head 10, and from the foil to the section 22 of the conductors 18. In the section 22 only one conductor, namely 18b, has a large surface area, thus the signal coupled to the conductor 18b would obviously be much greater than the signal coupled to any of the conductors 18a–h. The conductors 18a, g are coupled by way of one of a plurality of terminals 24, namely 24a, to a "character present" input of the storage register (FIG. 6) as will be described hereinafter. Conductors 18b–18g are connected to a respective one of the terminals 24b–24g. If, on conductors 18b–18g, a relatively large signal represents a logic "high" or "one", and a smaller signal, a "low" or "zero", the output at terminals 24b–24g can be read in parallel as the ASCII (American Standard Code for Information Interchange) 6-bit binary code for "A", or 100,000. In the section 23 of the conductors 18, which would underlie the "S" key, the conductors 18b, c and f have large areas. If the "S" key is depressed the signal at terminals 24b–24g would represent 110,010, the ASCII code for "S".

To review the operation of the keyboard of this embodiment, a standard format keyboard provides a coded output signal from each key corresponding directly to the associated alphanumeric character of control function. A signal such as the horizontal oscillator sweep signal of an associated monitor is applied to a base plate positioned beneath the keyboard, the plate being contacted by the center post of each key mechanism when the key is depressed. The center post of each key couples the signal to a conductive foil on the underside of the key head. Intermediate the base plate and the key heads is a printed circuit board covered by a thin insulating film. On the board and under each row of keys on the keyboard is a plurality of parallel plated conductors. The areas of the conductors immediately under each key head correspond to a binary code (such as the ASCII code) for that particular character of function, e.g., minimum conductor areas could represent binary "zeros" and maximum areas could represent "ones". When the key is depressed, the foil layer contacts the insulating film and the signal is capacitively coupled from the foil on the key head to the conductors on the printed circuit board. Thus the signal levels coupled by the smaller and larger areas of the conductors under that particular key provide output signals at the conductor terminals which correspond to the binary code. Additional parallel conductors are used to signal that a key has been depressed whereby the depression of two keys simultaneously would provide a double signal which can then be detected as an error, and provide lockout. Incomplete depression which could cause an incorrect output signal can also be detected.

The invention requires essentially the following: (a) that there be a substantial difference (preferably 20:1) in the conductor areas representing "ones" and "zeros", (b) that the sum of six "one" areas should be as close as possible to the total area under the key head 10 and, (c) that all "ones" should be represented by conductive portions having substantially identical areas though not necessarily identical shapes. Another embodiment of the conductors 18 pattern is shown in FIG. 4. Since the key head support means for this embodiment is the post 14 as shown in FIGS. 1 and 2, the printed circuit board 17 for this embodiment must have an aperture 25 for each support post.

FIG. 5 shows a second embodiment of the key mechanism, wherein the printed circuit board 17, bearing the conductors 18 and the Mylar film 20, is positioned beneath the conductive base plate 15. The foil 13 and the pressure pad 12 are mounted on a plate 26 at the bottom of the post 14. At least one contact member 27 will make electrical connection with the plate 15 when the key head 10 is depressed, the post 14 requiring insulation from the plate 15, as by a bushing 28. Again, the spring 16 is not a part of the conductive path between the plate 15 and the foil 13. In this embodiment, the code pattern can be simpler since no aperture 25 (FIGS. 1-4) is required. For example, all "ones" could be rectangular in shape.

In FIG. 6, the areas of conductors 18b-18g which represent "ones" are shown as single capacitor elements 30. The signals from the terminals 24b-g are detected and amplified by a plurality of high impedance CMOS inverters 32. The bias for the inverters is fed by a DC supply circuit 33. A terminal 34 is coupled to the signal source (not shown). If the keyboard is associated with a CRT or video display device (not shown), the signal source might be the horizontal sweep circuitry of the video device. The terminal 34 would couple the signal source to a circuit 35 which would provide a signal to base plate 15 and an inversion of that signal to connection point 36. At least one capacitor 37 couples a small portion of the inverted signal to those conductors, such as 18b,c,d,e, which have a larger number of "ones". These inverted signals compensate for the fact that conductors having relatively large total areas will have some signal coupled to them from undepressed keys, thus their zero levels need to be equalized. The capacitors 37 may be discrete components, or the inverted signals may be coupled to the widened lead portions adjacent the terminals 24a-24g from foil layers positioned above or below.

The two narrow conductors 18a,h, which provide an indication that one or more keys have been depressed, are positioned on the outer edges of the strip to allow for possible play in the key mechanism as it is depressed. They are coupled to the terminal 24a and may constitute one U-shaped conductor. The terminal 24a is coupled to a CMOS 40 for a "character present" indication, and to a CMOS 41 for a "multiple character present" indication. The CMOS 40, 41 are normally biased at a point just below threshold, the CMOS 41 threshold being substantially higher than threshold for CMOS 40. These thresholds are set so that the depression of only one key will cause only CMOS 40 to output, while the depression of two or more keys will cause both CMOS 40 and 41 to output, for an "error" indication.

Since the parallel outputs of the CMOS 32 represent in ASCII code the desired alphanumeric characters or functions, they may be coupled directly to circuitry known in the art for translating ASCII coded data into a data display. This circuitry is shown in block form in FIG. 6 and includes a register 42, a frame memory 43, a character row memory 44 and a character PROM decoder 45. A typical character display is indicated as reference number 46. The output of CMOS 40, 41 are coupled to the register 42, where the former provides a "clock" input and the latter indicates an error. The paralleled signal is stored in the frame memory 43 which feeds one character row at a time to the character row memory. The PROM decoder 45 then breaks down the characters in that row to the dots of each separate trace which are required to form the characters. The "A" of display 46 is of a typical 5 × 7 format, i.e., a matrix of 35 dots is available for character formation. If this "A" were the first character in a row of characters, the second, third and fourth dots of the first trace would be used; the first and fifth dots of the second trace, etc.

It has been shown that the keyboard of the invention uses keys which do not have to be unique, and which provide a self-encoded parallel output, requiring fewer and less expensive components as well as much simpler interconnection than any known prior art. A 6-bit ASCII code has been used by way of illustration, with no intention of limiting the invention thereto. While only one row of a keyboard has been shown, it is obvious that the principle of the invention covers an entire keyboard, with many modifications possible within the spirit and scope of the appended claims.

What is claimed is:

1. A self-encoding keyboard arrangement comprising in combination:

a plurality of first conductive surface portions, certain of said portions having relatively larger and smaller areas which have a predetermined relationship to a desired signal output;

support means for supporting the first conductive surface portions;

a plurality of key mechanisms, each comprising a key head, a second conductive surface portion, and a support member for supporting said key head and said second conductive portion, the second conductive surface portion being normally biased away from the first conductive surface portions and mounted for being movable toward a predetermined number of said first conductive surface portions when said key head is depressed;

a thin flexible insulating film interposed between the first and second conductive portions;

a signal source coupled to the first conductive surface portions when said key head is fully depressed; and a plurality of detectors, at least one of said detectors being coupled to each one of the first conductive surface portions for detecting a predetermined signal level on said first conductive portion in response to coupling between a relatively large area of said first conductive surface portion and the adjacent second conductive portion when the corresponding one of said key heads is depressed.

2. A self-encoding keyboard arrangement according to claim 1 wherein the key mechanism further includes a resilient pressure pad affixed to the underside of the key head and wherein the second conductive portion is affixed to the underside of said pressure pad.

3. A self-encoding keyboard arrangement according to claim 1 wherein, when one of said key heads is depressed, each relatively large area of one of said first conductive portions under said one key head provides a relatively high level output signal and each relatively small area of one of said first conductive portions under said one key head provides a relatively low level output signal.

4. A self-encoding keyboard arrangement according to claim 1 and wherein the key mechanism includes a third conductive portion and the apparatus further includes conductive plate means coupled to the signal source and positioned for being contacted by the third conductive portion when the key head is depressed.

5. A self-encoding keyboard arrangement according to claim 1 wherein each key head bears one of a plurality of indicia and wherein said desired signal output has a predetermined relationship to said indicia, whereby the depression of one of said key heads provides a parallel output signal corresponding to a binary code for the indicia on said key head.

6. A self-encoding keyboard arrangement according to claim 1 and further including circuit means coupled to said signal source for inverting said signal, and capacitive means for coupling a portion of said inverted signal to at least one of said first conductive portions, said portion of said signal having a predetermined relationship to the area of said first conductive portion.

7. A self-encoding keyboard arrangement according to claim 1 and further including fourth conductive portions adjacent the first conductive portions and positioned for receiving a second predetermined level of signals from one of the second conductive portions when a corresponding key head is depressed.

8. A self-encoding keyboard arrangement according to claim 7 and wherein at least one other of the detector means is coupled to the fourth conductive portions for detecting the second predetermined level of signal, and still another detector means is coupled to the fourth conductive portions for detecting signals levels greater than the second predetermined level of signal, whereby the simultaneous depression of more than one key head is detected.

* * * * *